United States Patent
Tenca et al.

(10) Patent No.: US 7,011,248 B2
(45) Date of Patent: Mar. 14, 2006

(54) ENCODER ARRANGEMENT

(75) Inventors: Vittorio Tenca, Caprino Veronese (IT); Corrado Carradori, Pescantina (IT)

(73) Assignee: PWB -Ruhlatec Industrieprodukte GmbH, Seebach (DE)

( * ) Notice: Subject to any disclaimer, the term of this patent is extended or adjusted under 35 U.S.C. 154(b) by 176 days.

(21) Appl. No.: 10/676,198

(22) Filed: Oct. 1, 2003

(65) Prior Publication Data

US 2005/0040235 A1 Feb. 24, 2005

(30) Foreign Application Priority Data

Oct. 2, 2002 (DE) .............................. 102 46 268

(51) Int. Cl.
*G06K 7/10* (2006.01)
(52) U.S. Cl. .................. 235/454; 235/462.35
(58) Field of Classification Search ................ 235/454, 235/435, 459, 462.35, 473; 250/231.14, 250/231.15, 231.16, 231.17, 231.18
See application file for complete search history.

(56) References Cited

U.S. PATENT DOCUMENTS

| | | | | |
|---|---|---|---|---|
| 3,796,476 A | * | 3/1974 | Frosch et al. ................... | 359/1 |
| 4,728,193 A | * | 3/1988 | Bartelt et al. ................ | 356/509 |
| 5,036,192 A | * | 7/1991 | Ishizuka et al. ....... | 250/231.16 |
| 5,059,791 A | * | 10/1991 | Ishizuka et al. ........ | 250/231.17 |
| 5,413,884 A | * | 5/1995 | Koch et al. ..................... | 430/5 |
| 5,477,526 A | * | 12/1995 | Inoue ....................... | 369/275.4 |
| 5,532,819 A | * | 7/1996 | Ishizuka et al. ........ | 250/237 G |
| 5,594,716 A | * | 1/1997 | Inoue ....................... | 369/275.4 |
| 5,602,388 A | | 2/1997 | Maenza | |
| 5,665,965 A | * | 9/1997 | Durham, III ........... | 250/231.13 |
| 5,825,023 A | | 10/1998 | Cai et al. | |
| 5,917,182 A | | 6/1999 | Ishizuka | |
| 6,384,501 B2 | * | 5/2002 | Braun .......................... | 310/91 |
| 6,437,324 B1 | * | 8/2002 | Braun et al. ............ | 250/231.14 |

FOREIGN PATENT DOCUMENTS

| | | |
|---|---|---|
| DE | 37 08 145 C2 | 9/1987 |
| DE | 195 18 714 | 12/1995 |
| DE | 197 01 941 A1 | 7/1997 |
| DE | 196 37 625 | 3/1998 |
| DE | 100 16 959 A1 | 10/2001 |
| GB | 2 038 578 A | 7/1980 |
| JP | 11296894 A * | 10/1999 |
| JP | 2000011422 A * | 1/2000 |

\* cited by examiner

*Primary Examiner*—Uyen-Chau N. Le
(74) *Attorney, Agent, or Firm*—Norris McLaughlin & Marcus, P.A.

(57) ABSTRACT

An encoder arrangement is described, consisting of a motor with a motor shaft, on which a timing disk is secured, a signal source for producing an optical signal as well as a beam mask for shaping the optical signal. The arrangement is characterized in that the beam mask is provided with code bars having pit and land structures that have a diffraction and interference structure.

5 Claims, 4 Drawing Sheets

ENCODER ARRANGEMENT

BACKGROUND OF THE INVENTION

The invention relates to an encoder arrangement including a motor with a motor shaft, on which a timing disk is secured, a signal source of an optical signal as well as a beam mask for shaping the optical signal.

Encoder arrangements of the aforedescribed type are used to measure various motion processes, wherein the measurement signals can be used for controlling or measuring the position of machine parts. The required measurement accuracy in fast motion processes is very high. In addition, care has to be taken that the optical signals travel absolutely parallel, and that measurement errors do not occur when the rotation direction changes.

Encoders are mass-produced in large quantities. Their costs are determined to a large extent by the manufacturing process and also by the complexity of adjusting the components.

It is the object of the present invention to further develop an encoder arrangement in such a way that the measuring accuracy is improved while at the same time reducing the production costs.

It is the object of the present invention to provide an encoder assembly of the initially mentioned type in such a way that the measuring accuracy is improved while at the same time reducing the production costs

SUMMARY OF THE INVENTION

This object is solved by the invention by the following measures:

1. The encoding bar of the beam mask is provided with pit and land structures which have a diffraction and interference structure.

2. The diffraction structure comprises preferably a 2D-sub-micrometer grating structure.

3. To reduce manufacturing cost, the beam mask is integrated with a mask support.

4. For increasing the positioning accuracy, the mask support has an opening for the motor shaft and a mask region with micro-interference structures and macroscopic structures.

5. The wear characteristic of the beam mask can be improved by using polycarbonate, wherein the regions between the encoding bars are made transparent and the pit and land structures include a thickness difference D, which satisfies the following function:

$$D=L/2(n-1)$$

with n=1.5 and L=wavelength of the optical signal.

6. If a prismatic body is inserted in the beam path for diverting and shaping the beam, then the signals sources and the signal receiver can be disposed on one side of the timing disk.

7. A particularly good parallelism of the optical signals can be achieved by providing the prismatic body with an essentially roof-shaped base structure, wherein the entering and exiting beam are reflected at the interior roof surfaces.

8. To use the most simple signals sources, a condenser optic must be integrated into region of the entering light beam in the base surface of the prismatic body.

9. For improving the integration and decreasing the manufacturing cost, a mask with mask support and the signal source are integrated in the prismatic body. For this purpose, a connecting plane is formed in the region of the beam entrance with a form-fit between a printed circuit board, which supplies power, and the prism.

10. The printed circuit board has at least one connector plane on which the prismatic body together with the signal source and the radiation detector can be arranged using simple plug connectors.

11. In a preferred embodiment, the mask support is formed as a precision injection-molded part with a common integration plane for the radiation source, the prismatic body and the radiation detector.

BRIEF DESCRIPTION OF THE DRAWINGS

The invention will be described hereinafter based on several examples.

It is shown in.

DETAILED DESCRIPTION OF THE PRESENTLY PREFERRED EMBODIMENTS

Encoding marks of timing disks of encoder arrangements consist typically of a sequence of stripes or bars. Typically, stripes with high transmission alternate with stripes with low transmission and/or reflection, so that the signals originating from a transmitter are modified by the changing optical structures or characteristic features of the transducer element. A signal processing stage generates from the modified signals information for the position or length measurement.

In a preferred embodiment of the present invention, the material measure is built on a light-diffracting 2D-sub-micrometer grating structure. In the third dimension, the phase of the transmitted or reflected light wave is determined. The light waves either are amplified or attenuated due to their changed phase when several partial waves interfere. The resulting signal can be used in a signal processing device as control signal for position and distance measurements.

The timing disk of the invention is manufactured, for example, by using a conventional film technology with an absorption pattern, and the mask is implemented by using a technology with a transmissive interference diffraction arrangement. These technologies can be combined to integrate functional elements of the sensor-mask application in different ways.

Figure 1:
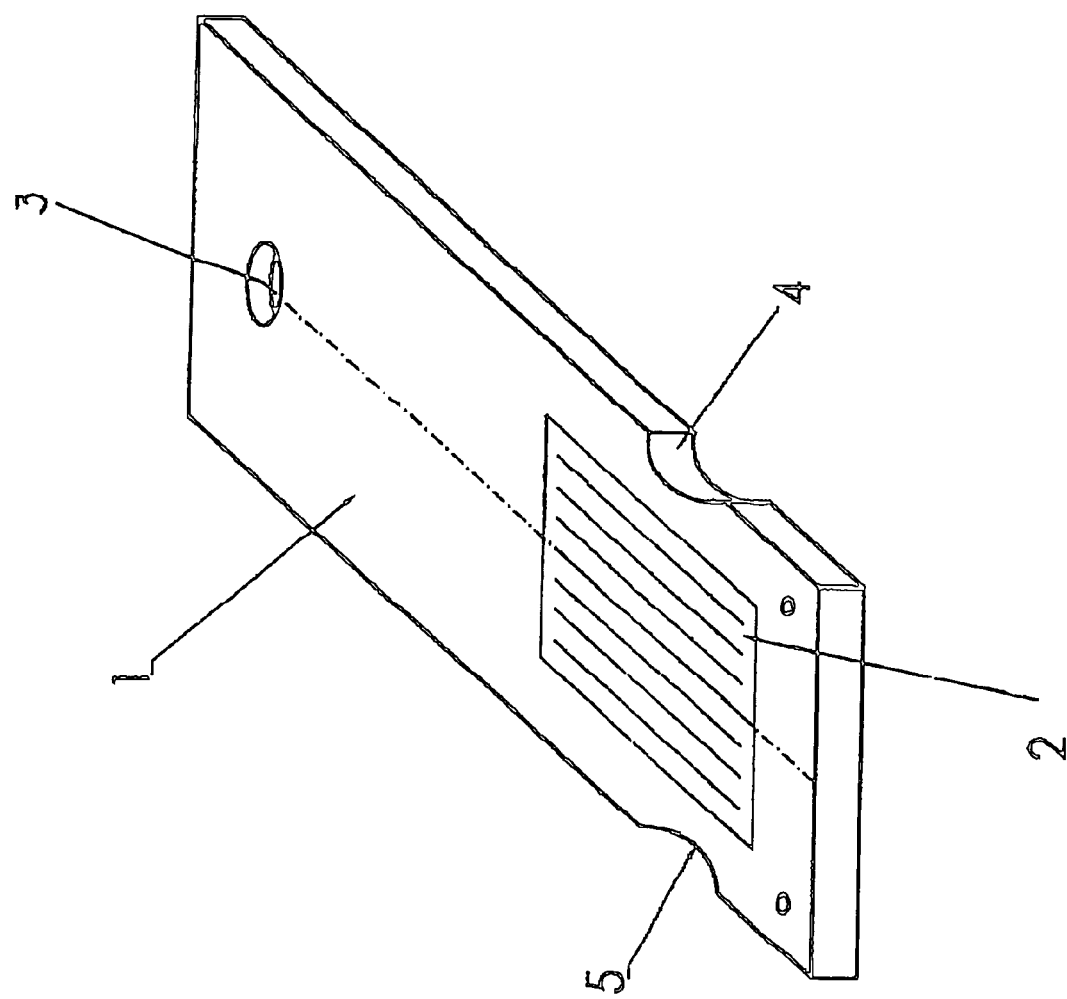
FIG. 1 a mask support with a beam mask including pit and land structures.

FIG. 1 shows a mask region with a micro-structure and macro-structure arranged on a surface of the mask support. The mask support 1 is subdivided into a mask region 2 and an adjusting region 3. The adjusting region 3 consists, for example, of a bore 3 for a motor shaft of the encoder (not shown). The recesses 4, 5 provide additional positioning options for supporting the mask.

Figure 2:
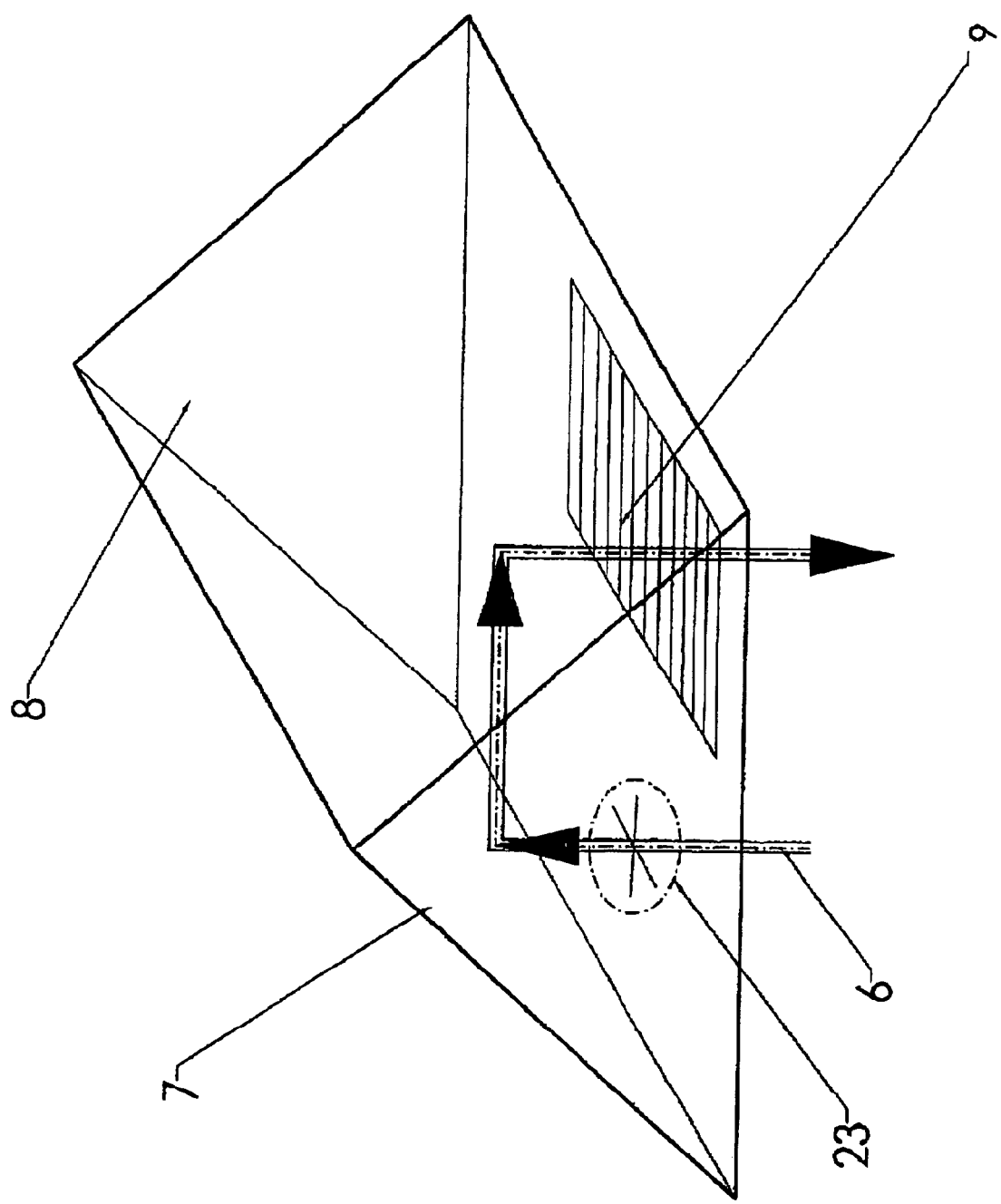
FIG. 2 a schematic diagram of a prismatic body for beam diffraction and beam conversion, FIG. 3 an overall explosive view of an encoder system, FIG. 4 a prismatic body with integration and connection plane.

FIG. 2 shows the beam path in a prismatic body. A condenser optics 6, which can improve parallelism and focus the beam, can be positioned on the entrance-side region of the beam. Since the prismatic body has a roof-shaped base structure, the entering and exiting beams are reflected on the interior roof surfaces 7, 8, so that the beam exits the prismatic body in the region of the beam mask 9 parallel to the entrance direction.

The structure of the beam mask is based on the pit and land structures and their thickness difference D, the value of which is calculated according to the formula recited in claim 5. The material of the transducer element can, for example, also consists of polycarbonate with a refractive index n=1.5, which significantly improves the wear characteristic in comparison to conventional materials. Comparative studies have shown that the lifetime of masks made of the material of the invention is increased by a factor of 5 compared to conventional devices.

Figure 3:
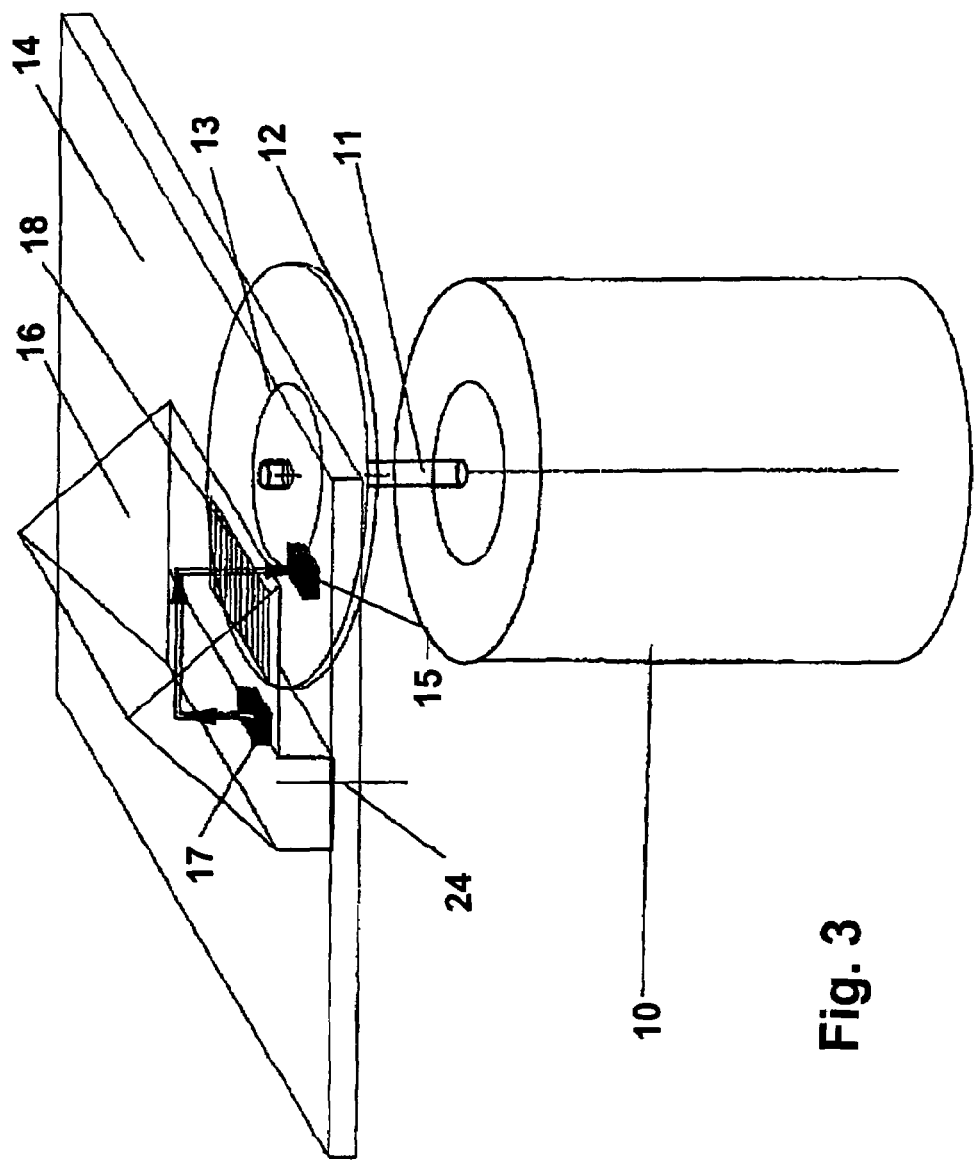

The overall construction of the encoder arrangement of the invention depicted in FIG. 3 consists of the following elements:
motor 10 with motor shaft 11
timing disk 12 with hub 13
printed circuit board 14 with signal receiver 15
prismatic body 16 with signal source 17 and beam mask 18
The illustration shows the following:
All components of the encoder arrangement of the invention are completely integrated, which allows their mutual positioning through simple plug connections. This reduces the manufacturing costs and increases the manufacturing accuracy by a factor of 10.

Figure 4:
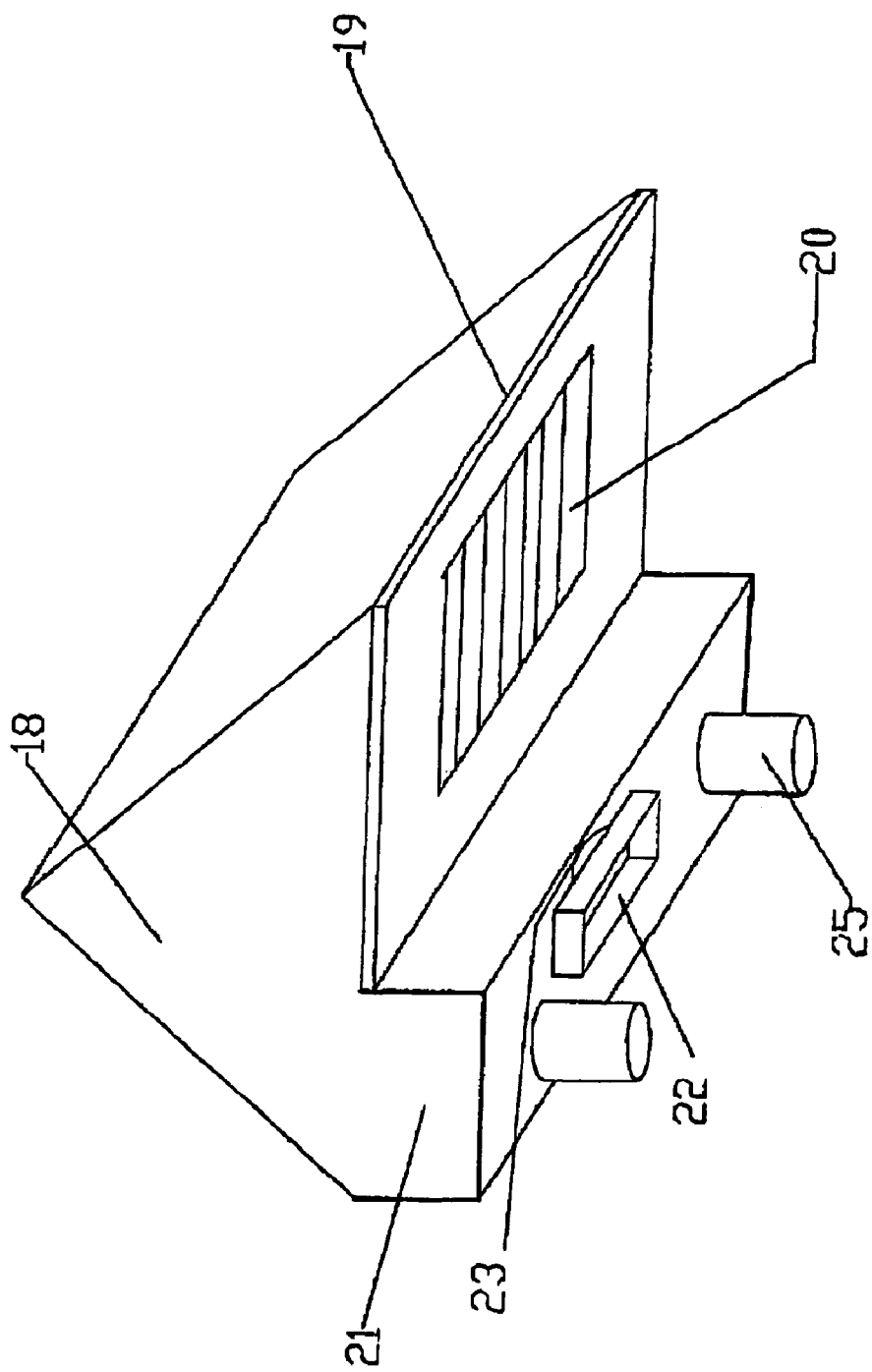

FIG. 4 shows again more clearly the complete integration of mask, prism, signal source and signal formation. The prismatic body 18 is provided with a mask support 19 in which the mask 20 is integrated.

A recess for the signal source is formed in a molded spacer element 21 which extends over a portion of the base surface of the prismatic body 18. Additional recesses can be introduced into the beam path, for example for a condenser optics 23.

Preferably, fastening pins 24, 25 are used to position the prismatic body 18 on the integrated circuit board. In this way, the optical signal transducer and/or the transducer elements, such as the timing disk and timing rulers, can be quickly and exactly positioned with the help of a simple plug connection.

What is claimed is:

1. An encoder arrangement, comprising
   a motor with a motor shaft on which a timing disk is secured,
   a signal source for generating an optical signal, as well as a beam mask for shaping the optical signal, wherein the beam mask is provided with code bars having pit and land structures having a diffraction and interference structure, wherein the beam mask is made of a polycarbonate, wherein regions between the code bars are made transparent and the pit and land structures includes thickness difference D, which satisfies the following function:

$$D = L/2(n-1)$$

with n=1.5 and L=wavelength of the optical signal.

2. An encoder arrangement, comprising
   a motor with a motor shaft on which a timing disk is secured,
   a signal source for generating an optical signal, as well as a beam mask for shaping the optical signal, wherein the beam mask is provided with code bars having pit and land structures having a diffraction and interference structure, wherein a prismatic body is introduced into the beam path for beam deflection and beam shaping, and
   wherein the beam mask is integrated with a mask support, wherein the mask support and the signal source wherein a connecting plane is formed in a region of the beam entrance with a form-fit between a printed circuit board and the prism.

3. The encoder arrangement according to claim 1, wherein the printed circuit board is provided with the connector plane and that the prismatic body together with the signal source and a beam receiver are disposed on the connector plane.

4. The encoder arrangement according to claim 3, wherein the mask support is formed as a precision injection-molded part with a common integration plane for a radiation source, the prismatic body and a radiation receiver.

5. An encoder arrangement, comprising
   a motor with a motor shaft on which a timing disk is secured,
   a signal source for generating an optical signal, as well as a beam mask for shaping the optical signal, wherein the beam mask is provided with code bars having pit and land structures having a diffraction and interference structure, wherein the beam mask comprises regions between the code bars are made transparent and the pit and land structures include a thickness difference D, which satisfies the following function:

$$D = L/2(n-1)$$

with n=1.5 and L=wavelength of the optical signal.

* * * * *